US012628678B2

(12) United States Patent
Mode et al.

(10) Patent No.:   US 12,628,678 B2
(45) Date of Patent:      May 12, 2026

(54) MANUFACTURING OF ELECTRONIC COMPONENTS

(71) Applicant: STMICROELECTRONICS (TOURS) SAS, Tours (FR)

(72) Inventors: Nicolas Mode, Tours (FR); Ludovic Fallourd, Louans (FR); Laurent Barreau, Joue les Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 481 days.

(21) Appl. No.: 18/154,638

(22) Filed: Jan. 13, 2023

(65) Prior Publication Data

US 2023/0230906 A1      Jul. 20, 2023

(30) Foreign Application Priority Data

Jan. 20, 2022    (FR) ..................................... 2200484

(51) Int. Cl.
  *H10W 70/05*        (2026.01)
  *H10W 70/65*        (2026.01)
  *H10W 74/01*        (2026.01)
  *H10W 74/10*        (2026.01)
  *H10W 74/47*        (2026.01)

(52) U.S. Cl.
  CPC ....... *H10W 70/657* (2026.01); *H10W 70/095* (2026.01); *H10W 70/65* (2026.01); *H10W 74/016* (2026.01); *H10W 74/121* (2026.01); *H10W 74/47* (2026.01)

(58) Field of Classification Search
  None
  See application file for complete search history.

(56) References Cited

U.S. PATENT DOCUMENTS

| 7,589,396 | B2 | 9/2009 | Zandman et al. |
| 8,922,013 | B2 | 12/2014 | Hwang et al. |
| 9,461,009 | B1 | 10/2016 | Higgins, III et al. |
| 2001/0002330 | A1 | 5/2001 | Benenati et al. |
| 2002/0066954 | A1 | 6/2002 | Huang et al. |
| 2006/0012967 | A1 | 1/2006 | Asai et al. |
| 2007/0190690 | A1 | 8/2007 | Chow et al. |
| 2008/0308917 | A1 | 12/2008 | Pressel et al. |
| 2009/0085186 | A1 | 4/2009 | Meyer |
| 2009/0102066 | A1 | 4/2009 | Lee et al. |
| 2009/0243097 | A1 | 10/2009 | Koroku et al. |
| 2010/0072599 | A1 | 3/2010 | Camacho et al. |
| 2010/0127386 | A1 | 5/2010 | Meyer-Berg |
| 2010/0246152 | A1 | 9/2010 | Lin et al. |

(Continued)

FOREIGN PATENT DOCUMENTS

| EP | 1085570 A2 | 3/2001 |
| EP | 3154085 A1 | 4/2017 |
| EP | 3282476 A1 | 2/2018 |

*Primary Examiner* — Jay C Chang
(74) *Attorney, Agent, or Firm* — Seed IP Law Group LLP

(57)          ABSTRACT

The present disclosure concerns a method of manufacturing an electronic component and the obtained component, comprising a substrate, comprising the successive steps of: depositing a first layer of a first resin activated by abrasion to become electrically conductive, on a first surface of said substrate comprising at least one electric contact and, at least partially, on the lateral flanks of said substrate; partially abrading said first layer on the flanks of said substrate.

20 Claims, 4 Drawing Sheets

(56)  References Cited

U.S. PATENT DOCUMENTS

| 2012/0034760 | A1 | 2/2012 | Schuderer et al. | |
|---|---|---|---|---|
| 2012/0178251 | A1 | 7/2012 | Lim et al. | |
| 2013/0105991 | A1 | 5/2013 | Gan et al. | |
| 2013/0113098 | A1 | 5/2013 | Hwang et al. | |
| 2013/0161813 | A1 | 6/2013 | Miki | |
| 2014/0015131 | A1 | 1/2014 | Meyer et al. | |
| 2014/0054796 | A1 | 2/2014 | Gong et al. | |
| 2016/0013172 | A1 | 1/2016 | Lin et al. | |
| 2017/0084686 | A1 | 3/2017 | Wang et al. | |
| 2017/0316957 | A1 | 11/2017 | Chen et al. | |
| 2017/0323840 | A1 | 11/2017 | Chiu et al. | |
| 2017/0345764 | A1 | 11/2017 | Chang et al. | |
| 2018/0005912 | A1 | 1/2018 | Oh et al. | |
| 2018/0096975 | A1 | 4/2018 | Hua et al. | |
| 2018/0330966 | A1 | 11/2018 | Scanlan et al. | |
| 2019/0115287 | A1 | 4/2019 | Derai et al. | |
| 2019/0259629 | A1 | 8/2019 | Ziglioli | |
| 2020/0126877 | A1 | 4/2020 | Takaoka | |
| 2021/0175203 | A1 | 6/2021 | Fallourd et al. | |
| 2021/0175204 | A1 | 6/2021 | Fallourd et al. | |
| 2021/0366732 | A1 | 11/2021 | Chiang et al. | |
| 2022/0375840 | A1* | 11/2022 | Ory | H01L 24/03 |
| 2024/0088068 | A1* | 3/2024 | Vincent | H01L 24/24 |

* cited by examiner

MANUFACTURING OF ELECTRONIC COMPONENTS

BACKGROUND

Technical Field

The present disclosure concerns the manufacturing of electronic components, for example, the manufacturing of so-called surface mount components.

Description of the Related Art

In certain applications, there is a need for surface mount components where connection metallizations are intended to be soldered to an external device that extend all the way to the flanks of the components. In other words, these surface mount components may have wettable flanks. During the assembly of the component in its environment (for example, on a printed circuit board), the connection metallizations, or electric contacts, are welded or soldered to corresponding metal tracks or elements on the printed circuit side. A portion of the solder material then extends on the wettable flanks of the components, which enables implementation of a visual inspection of the quality of the connections. This need, for example, exists in the automobile field and the medical field and, more generally, in fields where the reliability of the electric connections is desired to be guaranteed, once the circuits have been assembled in their environment.

It would be desirable to at least partially improve certain aspects of known methods of manufacturing electronic components or surface mount components with wettable flanks.

BRIEF SUMMARY

There is a need to improve known electronic devices and their manufacturing methods.

At least one embodiment of the present disclosure at least partially overcomes the disadvantages of known wettable flank component manufacturing methods.

At least another embodiment of the present disclosure provides a method of manufacturing an electronic component, comprising a substrate, comprising the successive steps of:

depositing a first layer of a first resin activated by abrasion to become electrically conductive, over a first surface of said substrate comprising at least one electric contact and, at least partially, on lateral flanks of said substrate;

partially abrading said first layer on the flanks of said substrate.

According to an embodiment, the abrasion step is performed by laser, which may be referred to as a laser ablation step. For example, when the laser is exposed to the first resin, the laser may activate a dopant within the first resin such that the dopant becomes conductive when exposed to the laser. The dopant may be referred to as an additive dopant, an activatable dopant, or some similar or like reference to the dopant that becomes conductive when exposed to the laser.

According to an embodiment, the abrasion step is performed with a mechanical cutting device.

According to an embodiment, if the first resin has not been activated by abrasion, it is electrically insulating. For example, the first resin may be doped with a dopant that is initially non-conductive until the dopant is activated by the abrasion step, which may be performed by various types of removal tools (e.g., mechanical cutting device, laser, etc.).

According to an embodiment, the first resin comprises a basic material and metal particles covered with an electrically-insulating protective layer. For example, the metal particles, which may be referred to as dopants, of the first resin are present within the basic material of the first resin.

According to an embodiment, the basic material is selected from the group comprising: epoxy-type resins and acrylic-type resins.

According to an embodiment, the metal particles are made of a material selected from the group comprising: copper, an alloy comprising copper, titanium, an alloy comprising titanium, nickel, an alloy comprising nickel, silver, and an alloy comprising silver. These metal particles may be referred to as dopants.

According to an embodiment, during the abrasion step, a cavity is formed.

According to an embodiment, the abrasion step is performed at a distance in the range from 5 to 20 μm from the flanks of the component.

According to an embodiment, the method further comprises a step of forming of at least one electrically-conductive via, in contact with said at least one electric contact, through said first layer.

An embodiment provides an electronic component comprising a chip protected by a package having at least one electric contact extending on a portion of a first surface of said package and a portion of a flank of said package formed thereon, the first surface being, further, a layer of a first resin activated by abrasion to become electrically conductive.

According to an embodiment, the component is obtained according to the described method.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected, or they can be coupled via one or more other elements.

In the following disclosure, unless otherwise specified, when reference is made to absolute positional qualifiers, such as the terms "front," "back," "top,", "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

The present disclosure concerns various embodiments of methods of manufacturing of electronic components, for example, the manufacturing of so-called embodiments of surface mount components. In at least some embodiments of the present disclosure, the surface mount components comprise, on a side of at last one surface, one or a plurality of connection metallizations (e.g., one or more connection metallizations), intended to be soldered to corresponding connections areas of an external device, which may be, for example, a printed circuit board or another component.

Figure 1:
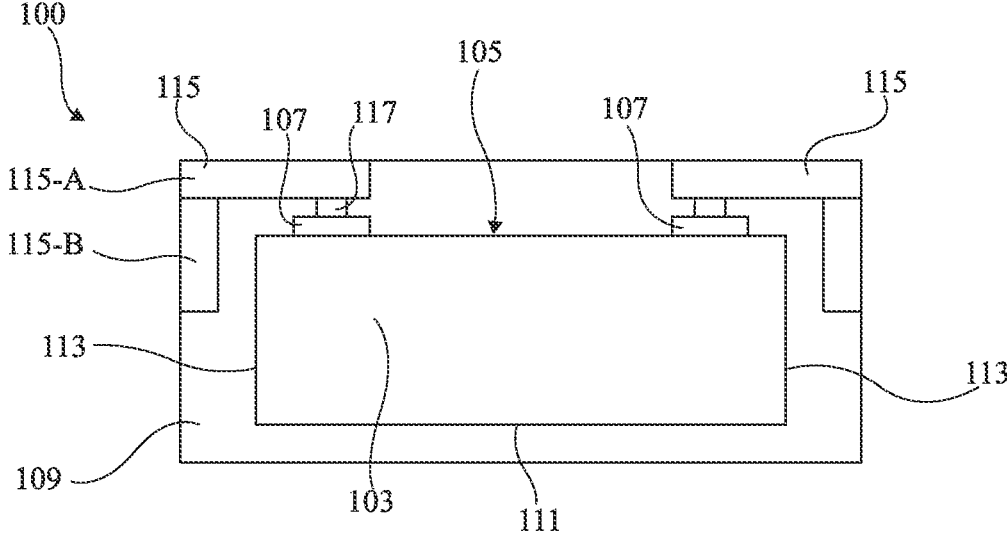
FIG. 1 shows a cross-section view of an embodiment of an electronic component with wettable flanks of the present disclosure.

FIG. 1 illustrates, in a partial simplified cross-section view, an electronic component 100.

Electronic component 100 is formed of an electronic chip 103 and of a package 109. According to an example, electronic chip 103 is formed from a semiconductor substrate, for example, made of silicon. One or a plurality of connection pads, or electric contacts, 107 are formed on the upper surface 105 of electronic chip 103 and enable to connect it to other chips or electronic devices. Chip 103 comprises one or a plurality of discrete components and/or one or a plurality of electronic circuits enabling it to implement different electronic functions. Component 100 thus is an integrated component, that is, a component comprising one or a plurality of discrete components and/or one or a plurality of electronic circuits.

Electronic component 100 is protected by a package 109 surrounding chip 103. More particularly, package 109 covers surface 105, but also a surface 111 of chip 103 opposite to surface 105, and the flanks 113 of chip 103, that is, the lateral surfaces of chip 103. The flanks or lateral surfaces 113 of chip 103 are transverse to respective surfaces 105, 111 and extend from surface 105 to surface 111. Package 109 is, for example, made of an electrically-insulating material. According to a variant, package 109 may not fully surround chip 103, and only protect its surface 105 and, at least partially, its flanks 113. In other words, in some embodiments, surface 111 may be exposed from package 109. For example, the package 109 may be a doped epoxy resin, a doped acrylic resin, or some other similar or like type of resin, molding compound, or packaging material that is doped with an activatable dopant, which may be referred to as an additive dopant, an additive activatable dopant, or some other similar or like reference, that becomes electrically conductive when abraded. This abrasion may be carried out with a mechanical cutting tool, a laser, or some other abrasion tool to activate the activatable dopant within the packaging 109.

To be able to connect component 100 to other electronic components and/circuits, package 109 further comprises contacting area 115 or contacts of the package, each coupled to a connection 107 of chip 103 via one or a plurality of electrically-conductive vias 117. More precisely, contacting areas 115 comprise a portion 115-A formed on the portion of package 109 covering surface 105 of chip 103, and a portion 115-B formed on the portion 109 covering the flanks 113 of chip 103, portions 115-A and 115-B being in contact. Contacting areas 115 are made of an electrically-conductive and "wettable" material, that is, a material on which it is possible to solder. Portions 115-B may for example cover at least 25% of the thickness of component 100. According to an example, portions 115-B may have a height in the order of 100 µm for a component 100 having a thickness in the order of 400 µm.

In other words, the contacts 115 of package 109 rest on at least a portion of the flanks of package 109, which corresponds to at least a portion of a surface and a portion of the flanks of component 100. Thus, component 100 is a component with wettable flanks.

According to an embodiment, component 100 is a "flip-chip" type surface mount component, that is, a component intended to be bonded to a support, for example, a printed circuit board, by its upper surface, that is, the surface having the contacts 115 of package 109 arranged thereon.

Figure 2:
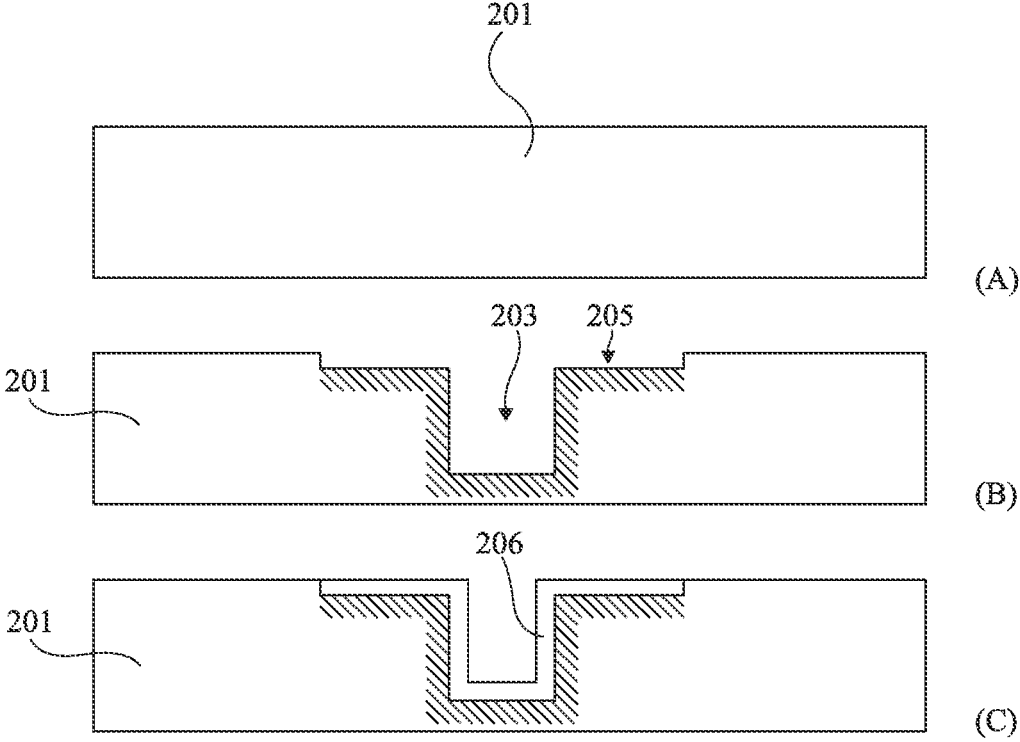
FIG. 2 shows three cross-section views illustrating an embodiment of a metallization forming method of the present disclosure.

FIG. 2 comprises three very simplified cross-section views (A), (B), and (C) illustrating steps of a method of forming a metallization on a layer 201.

At the step of view (A), layer 201 is presented. Layer 201 is a layer made of an electrically-insulating resin (e.g., an insulating resin doped with an activatable dopant) activated by abrasion to become electrically conductive. For example, the packaging 109 may be made of the insulating or non-conductive resin in which additive materials are present to be activated (e.g., converted to be electrically conductive) by abrasion to become electrically conductive. More particularly, the resin of layer 201 comprises at least one basic material having metal particles covered with and present within an electrically-insulating protective layer added thereto. The basic material is selected from the group comprising: epoxy-type resins and acrylic-type resins. The metal particles are for example metal particles having their material selected from the group comprising: copper, an alloy comprising copper, titanium, an alloy comprising titanium, nickel, an alloy comprising nickel, silver, and an alloy comprising silver. In other words, the basic material may be a non-conductive material in which trace amounts of activatable dopants are within such that when an abrasion step is performed the trace amounts of dopants are activated resulting electrically conductive portions or a thin layer of electrically conductive material being formed, which will be described in further detail with respect to views (B) and (C) as follows herein.

At the step of view (B), successive to the step of view (A), a cutting device, or etching device, is used to etch the surface of layer 201 and, for example, form a cavity 203 in layer 201. This cutting or etch step enables to expose the metal particles of the resin of layer 201 at the surface (symbolized by the hatchings in views (B) and (C) of FIG. 2). This step is also called resin activation step, indeed, the portion of layer 201, where the metal particles are close to the surface, has become electrically conductive. More particularly, it is said that the material of edges 205 of cavity 203 has been activated by the cutting device, that is, the material of edges 205 has been made locally electrically conductive by the use of the cutting device. In practice, during the use of the cutting device, the electrically-insulating protective layer covering the metal particles of the abrasion-activated electrically-insulating resin is disaggregated, and the metal particles migrate towards the surface of the material. The particles then being exposed and at the surface, the resin then becomes conductive. In other words, electrically conductive portions or a thin layer of electrically conductive material, which may be a continuous layer or multiple discrete portions, is formed and present along the edges 205 of the cavity 203, which is represented by the cross-hatching as shown in view (B). The edges 205 may be microscopically roughened surfaces at which the additive activatable material is activated along such that the additive activatable material is conductive and is present along and on the edges 205.

The cutting device is for example a mechanical etching tool such as a saw, or a laser etching tool such as a laser. According to a preferred embodiment, the cutting device is a laser. Further, when the cutting device is a laser, the cutting technique used may be a technique of laser direct structuring (LDS) type.

At the step of view (C), a metallization is formed at the level of the edges 205 of cavity 203, that is, at the level of the activated portion of the material of layer 201. For this purpose, a metal layer 206 is deposited by a method of chemical deposition on edges 205. Edges 205 having become electrically conductive at the step of view (C), metal layer 206 adheres well to layer 201. More particularly, the metal particles of the material of layer 201 are used as a binder for metal layer 206. Implementing the step of view (B) enables to make the deposition of metal layer 206 selective, indeed metal layer 206 only adheres to the activated edges of layer 201. Metal layer 206 thus forms a metallization and has a thickness in the range, for example, from 5 μm to 100 μm.

The step of view (C) may, for example, be followed by a finishing step of deposition of a layer of ENIG (Electroless Nickel Immersion Gold) type. This step enables to improve and improves the wettability of the metallization. After the step of view (C), while not shown in detail the activated additive material is present along the edges 205, a first conductive layer (e.g., metallization layer formed through the chemical vapor deposition on edges 205), and a second conductive layer (e.g., the layer of ENIG) is stacked on the first conductive layer such that the metal layer 206 includes the first conductive layer on which the second conductive layer is stacked.

Figure 3:
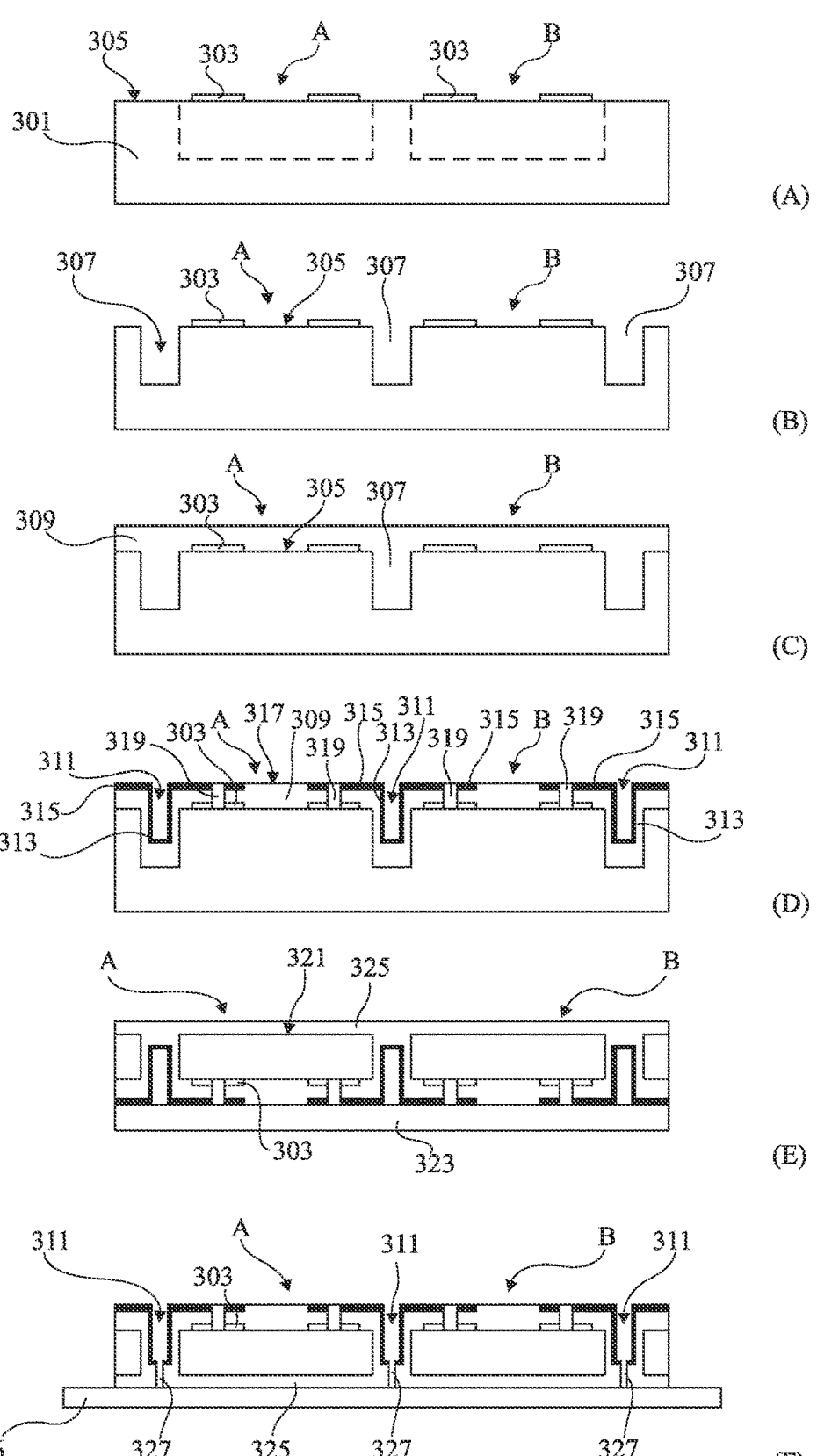
FIG. 3 shows six cross-section views illustrating steps of an implementation mode of a method of forming an embodiment of an electronic component with wettable flanks of the present disclosure.

FIG. 3 comprises six simplified cross-section views (A), (B), (C), (D), (E), and (F), illustrating steps of an implementation mode of a method of manufacturing two components A and B of the type of the component 100 described in relation with FIG. 1. The steps described hereafter correspond, in particular, to the method of individualization of the components and of the forming of their protection package.

At the step of view (A), the manufacturing of the discrete component(s) and/or integrated circuits forming components A and B is ended. Components A and B are formed from a same substrate 301 and have not been individualized yet. The contour of the portion of substrate 301 where the chips have been formed is delimited by a dotted line. Substrate 301 is for example a semiconductor substrate, for example, made of silicon.

Further, at the step of view (A), electric contacts 303, of the type of the contacts 107 described in relation with FIG. 1, have been formed on an upper surface 305 of substrate 301.

In FIG. 3, components A and B, in view (A), have similar dimensions, and each comprise at least two electric contacts 303. However, according to a variant, components A and B have different dimensions, and a different number of electric contacts, it will be within the abilities of those skilled in the art to adapt the manufacturing method described herein in this case.

At the step of view (B), successive to the step of view (A), a step of partial cutting of components A and B is operated, for example, by a mechanical cutting method, such as a sawing method. Thus, cavities 307 defining the lateral contours of the chips of components A and B are formed in substrate 301, and from its surface 305. More particularly, cavities 307 extend from surface 305 and down to a depth corresponding to the minimum at the height of the portions of the contacting areas covering the flanks of components A and B described hereafter. According to an example, the depth of cavities 307 corresponds to the desired thickness of the chips of components A and B. According to an example, the depth of cavities 307 is in the order of 100 or 300 μm.

At the step of view (C), successive to the step of view (B), a layer 309 of the type of the layer 201 described in relation with FIG. 2, that is, a layer made of an electrically-insulating resin activated by abrasion to become electrically conductive, is deposited, for example by molding. More particularly, layer 309 is deposited in cavities 307 and on surface 305 of substrate 301 and contacts 303. Layer 309 forms a first portion of the package of components A and B. As an example, layer 309 may be deposited by silk screening, by compression, or by injection. This first portion of the package thus protects the upper surface of components A and B, and at least a portion of, preferably all, the flanks of components A and B.

At the step of view (D), successive to the step of view (C), a cutting method of the type of that described in relation with FIG. 2 is implemented to form cavities 311 in layer 309. Cavities 311 are formed at the level of cavities 307. According to an example, the cavities 311 are formed at a distance in the range from 5 to 20 μm from the flank of chips of components A and B. Further, portions of the upper surface 317 of layer 309 are etched by this same cutting method. In some embodiments, the cavities 311 are formed such that each respective cavity of the cavities 311 overlaps a corresponding cavity of the cavities 307 and each respective cavity of the cavities extends at least partially into the corresponding cavity of the cavities 307.

The cavities 311 may be referred to as recesses, cut outs, or some other similar or like reference to the cavities 311.

As previously described, the edges 313 of cavities 311 and the portions of surface 317 of layer 309 are made electrically conductive, by metallization, due to the implementation of this cutting method.

Further, at the step of view (D), the contacting areas of the package of components A and B, corresponding to the portions 115-A and 115-B described in relation with FIG. 1, are formed. For this purpose, an electrically-conductive layer 315, preferably a metal layer, is selectively deposited on the edges 313 of cavities 311, and the activated portions of surface 317 of layer 309. The metallizations on edges 313 form the portions 115-B of the contacting areas, that is, the wettable flanks of components A and B, and the metallizations on the activated portions of surface 317 of layer 309 form the portions 115-A of the contacting areas of components A and B.

According to an embodiment, layer 315 is a metal layer, for example, a copper or nickel layer. According to an example, layer 315 is deposited by a chemical (electroless) deposition method, or by a metal deposition method, for example, a copper plating method, preceded by a masking step.

According to an embodiment, contacts 303 may be topped with metal pads on surface 305 of substrate 301, allowing a direct contact recovery on the front side of the package after the deposition of layer 309. According to an example, these pads may be of bump type, that is, metal balls, or of pillar type, that is, formed by metal growth, and have a height in the range from 20 to 80 μm.

Further, at the step of view (D), an electrically-conductive via is formed in layer 309 to couple contact 303 to the overhanging layer 315. Via 319 is for example further covered with a material of ENIG, for Electroless Nickel Immersion Gold, type.

At the end of the step of view (D), the contacts of the package of components A and B are completely formed.

From the step of view (E), successive to the step of view (D), the back of the package of components A and B is formed. For this purpose, the structure of view (D) is flipped and bonded by its front side, that is, surface 317 of layer 309, on a support 323. Support 323 is for example a strip of adhesive tape. The structure is thinned from its back side 321, corresponding to the back side of substrate 301 opposite to its surface 305, so that substrate 301 has its final thickness. According to an example, structure 301 is thinned from its back side 321 to reach the back, rear, or bottom of cavities 307.

Figure 4:
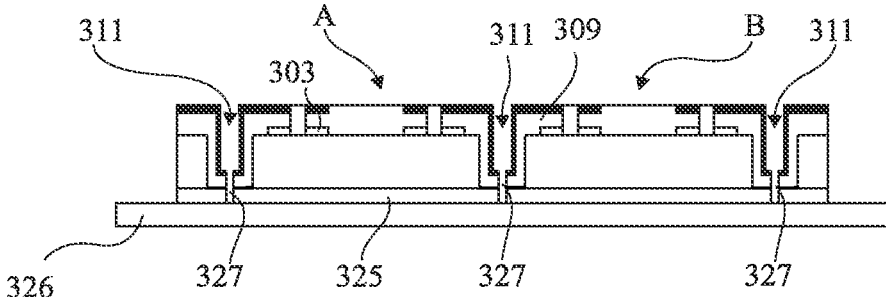
FIG. 4 shows a cross-section view illustrating a step of an implementation mode of a method of forming an embodiment of an electronic component with wettable flanks of the present disclosure.

Further, at the step of view (E), a layer 325 is deposited on the back side 321 of the structure to form the back of the package of components A and B. Layer 325 is layer made of an electrically-insulating material, for example, a resin, for example, a resin of the same type as the resin of layer 309. According to another example, the materials of layers 309 and 325 are different (see, for example, FIG. 4 of the present disclosure in which the materials of layers 309 and 325 are shown as being separate and distinct layers since the materials of layers 309 and 325 are different in FIG. 4). Layer 325 is deposited on surface 321 and on the portions exposed during the step of thinning of cavities 307, so that all the surfaces of substrate 301 are protected either by layer 309, or by layer 325. The second portion of the package then protects the back side of components A and B and, possibly, the rest of the flanks of components A and B unprotected by the first portion of the package.

At the step of view (F), successive to the step of view (E), components A and B are finally individualized. For this purpose, the structure of view (E) is removed from support 323, and then flipped, and its back side 321 covered with layer 325 is bonded to a support 326 adapted to the individualization step. This support is for example a strip of adhesive tape adapted to the cutting method.

Finally, components A and B are individualized by a cutting method, for example by a sawing method or, for example, a laser cutting method, during which cavities 327 are formed at the level of the back, rear, or bottom of cavities 311. Cavities 327 extend from the back of cavities 311 and across the entire thickness of layer 325 to separate the components from one another. Components A and B are now individualized. The cavities 327 may be referred to as recesses, cut-outs, or some other similar or like reference to the cavities 327.

Various embodiments and variants have been described. Those skilled in the art will understand that certain features of these various embodiments and variants may be combined, and other variants will occur to those skilled in the art. In particular, it will be within the abilities of those skilled in the art to adapt the manufacturing method described in relation with FIG. 3 to first form the back of the package of components A and B, and then the front of the package of components A and B.

Finally, the practical implementation of the described embodiments and variations is within the abilities of those skilled in the art based on the functional indications given hereabove.

At least one embodiment of a method of manufacturing an electronic component (A, B) of the present disclosure may be summarized as including a substrate (301), including the successive steps of depositing a first layer (309) of a first resin activated by abrasion to become electrically conductive, on a first surface (305) of said substrate (301) including at least one electric contact (303) and, at least partially, on lateral flanks of said substrate (301); and partially abrading said first layer (309) on the flanks of said substrate (301).

The abrasion step may be performed by laser.

The abrasion step may be performed with a mechanical cutting device.

If the first resin has not been activated by abrasion, it may be electrically insulating.

The first resin may include a basic material and metal particles covered with an electrically-insulating protective layer.

The basic material may be selected from the group including epoxy-type resins and acrylic-type resins.

The metal particles may be made of a material selected from the group including copper, an alloy including copper, titanium, an alloy including titanium, nickel, an alloy including nickel, silver, and an alloy including silver.

During the abrasion step, a cavity (311) may be formed.

The abrasion step may be performed at a distance in the range from 5 to 20 μm from the flanks of the component.

Method may further include a step of forming of at least one electrically-conductive via (319), in contact with said at least one electric contact (303), through said first layer (309).

Electronic component (A, B) may be summarized as including a chip protected by a package having at least one electric contact extending over a portion of a first surface of said package and a portion of a flank of said package formed therein, the first surface being, further, a layer (309) of a first resin activated by abrasion to become electrically conductive.

Component may be obtained according to the method.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

forming a first recess extending into a first surface of a substrate, forming the first recess includes forming flanks of the substrate that are transverse to the first surface of the substrate and define the first recess;

depositing a first layer of a first resin on the first surface of the substrate and at least partially on the flanks of the substrate, the first resin including a base material and an additive activatable material within the base material, the additive activatable material is activatable by abrasion to become electrically conductive; and forming a second recess in the first resin overlapping the first recess, forming the second recess includes forming flanks of the first resin that are transverse to the first surface of the substrate, activating the additive activatable material of the first resin within the second recess, and forming one or more conductive portions of the additive activatable material on and along the flanks of the first resin that define the second recess by partially abrading the first layer of the first resin on and along flanks of the substrate.

2. The method according to claim 1, wherein forming the second recess in the first resin overlapping the first recess, activating the additive activatable material of the first resin within the second recess, and forming the one or more conductive portions of the additive activatable material on and along flanks of the second recess is performed by laser.

3. The method according to claim 1, wherein forming the second recess in the first resin overlapping the first recess, activating the additive activatable material of the first resin within the second recess, and forming the one or more conductive portions of the additive activatable material on and along flanks of the second recess is performed with a mechanical cutting device.

4. The method according to claim 1, wherein the first resin including the base material and the additive activatable material is non-conductive before activating the additive activatable material by abrasion.

5. The method according to claim 1, wherein:

the base material is an electrically non-conductive material that disaggregates when forming the second recess, activating the additive activatable material, and forming one or more conductive portions of the additive activatable material by partially abrading the first layer on and along the flanks of the substrate; and the additive activatable material are metal particles covered with the electrically non-conductive material of the base material.

6. The method according to claim 5, wherein the base material is selected from a group comprising: epoxy-type resins and acrylic-type resins.

7. The method according to claim 5, wherein the metal particles are selected from a group comprising: copper, an alloy comprising copper, titanium, an alloy comprising titanium, nickel, an alloy comprising nickel, silver, and an alloy comprising silver.

8. The method according to claim 1, wherein forming the second recess in the first resin overlapping the first recess, activating the additive activatable material of the first resin within the second recess, and forming one or more conductive portions of the additive activatable material on and along flanks of the second recess is performed, the flanks of the second recess are spaced apart at a distance in a range from 5 to 20 μm from the flanks of the first recess of the substrate.

9. The method according to claim 1, further comprising forming of at least one electrically-conductive via through the first layer of the first resin and in contact with at least one electric contact at the first surface of the substrate.

10. A method, comprising:

forming a first recess with first flanks extending into a first surface of a substrate and terminating before reaching a second surface of the substrate opposite to the first surface;

forming a doped resin within the first recess, the doped resin being doped with additive dopants that become electrical conductive when activated;

forming a second recess with second flanks extending into the doped resin, terminating within the doped resin before reaching the substrate, extending into the first recess in the substrate, and spaced apart from the first flanks by utilizing a laser, forming the second recess by utilizing the laser includes simultaneously activating and exposing the additive dopants along and on the second flanks of the second recess;

forming a first conductive layer on the additive dopants activated and exposed along and on the second flanks of the second recess; and forming a second conductive layer on the first conductive layer.

11. The method of claim 10, further comprising removing a portion of the substrate at the second surface of the substrate exposing an end of the doped resin within the first recess and forming a third surface of the substrate substantially coplanar with the end of the doped resin.

12. The method of claim 11, wherein forming a third recess extending from the second recess to the end of the doped resin.

13. The method of claim 11, further comprising forming a non-conductive layer on the third surface of the substrate and on the end of the doped resin.

14. The method of claim 13, wherein the non-conductive layer is made of a different material than the doped resin.

15. The method of claim 13, wherein the non-conductive layer is made of a first resin of a first layer.

16. The method of claim 13, further comprising forming a third recess extending from the second recess to a fourth surface of the non-conductive layer facing way from the substrate.

17. The method of claim 10, further comprising:

forming an opening extending into the doped resin to the first surface of the substrate and to a contact at the first surface of the substrate; and forming a conductive via in the opening and coupled to the contact at the first surface of the substrate.

18. The method of claim 17, wherein the conductive via is coupled to the first and second conductive layers.

19. A method, comprising:

forming a first recess extending into a first surface of a substrate, forming the first recess includes forming a first end surface of the substrate and forming first flanks of the substrate, the first flanks are transverse to the first surface and the first end surface the first flanks extend from the first surface to the first end surface, and the first end surface of the substrate and the first flanks of the substrate define the first recess;

depositing a first layer of a first resin on the first surface of the substrate and at least partially on the first flanks of the substrate, the first resin including a second surface, a base material, and an additive activatable material within the base material, the additive activatable material is activatable by abrasion to become electrically conductive; and performing an abrading process on the first resin, the abrading process includes:

removing a portion of the first resin forming a second recess extending into the first resin and extending into the first recess, forming the second recess includes forming a second end surface of the first resin and forming second flanks of the first resin, the second flanks extend from the second surface to the second end surface, are transverse to the second surface and the second end surface, and are spaced inward from the first flanks, the second flanks of the first resin and the second end surface of the first resin define the second recess, and removing the portion of the first resin forming the second recess activates the additive activatable material of the first resin within the second recess forming one or more conductive portions of the additive activatable material on and along the second flanks and the second end surface of the second recess; and depositing a metal layer on the one or more conductive portions of the additive activatable material on and along the second flanks and the second end surface of the second recess.

20. The method of claim 19, wherein performing the abrading process on the first resin further includes:

roughening a region adjacent to the second recess at and along the second surface of the first resin to activate the additive activatable material along the region adjacent to the second recess at and along the second surface of the first resin.

* * * * *